United States Patent [19]

Groseck

[11] Patent Number: 4,501,455
[45] Date of Patent: Feb. 26, 1985

[54] LOCKING AND EXTRACTION MECHANISM FOR RACK MOUNTED COMPONENTS

[75] Inventor: John B. Groseck, Philadelphia, Pa.
[73] Assignee: Honeywell Inc., Minneapolis, Minn.
[21] Appl. No.: 339,270
[22] Filed: Jan. 15, 1982
[51] Int. Cl.³ .............................................. E05B 1/00
[52] U.S. Cl. ..................... 312/215; 312/71; 312/320; 312/333
[58] Field of Search .............. 312/61, 71, 122, 320, 312/333, 215; 211/4, 49 D; 403/315, 316, 319, 321, 325; 292/194, 204, 202, 218, 213; 339/75-78

[56] References Cited

U.S. PATENT DOCUMENTS

| | | | |
|---|---|---|---|
| 265,400 | 10/1882 | Fitch | 211/49 D |
| 423,730 | 3/1890 | Charlton | 24/590 |
| 1,291,420 | 1/1919 | Cough | 211/49 D |
| 1,702,987 | 2/1929 | Wilson | 211/49 D |
| 2,514,246 | 7/1950 | Knox | 312/320 |
| 2,671,149 | 3/1954 | Hubbell et al. | 339/75 A |
| 4,221,450 | 9/1980 | Sears | 339/75 R |

Primary Examiner—William E. Lyddane
Assistant Examiner—Joseph Falk
Attorney, Agent, or Firm—Mitchell J. Halista; Trevor B. Joike

[57] ABSTRACT

A locking and extraction mechanism for a rack mounted component uses a selectively actuable extraction hook slideably retained in a lock block for engaging in a first position of the hook a peripheral edge of the rack mounted assembly. The hook is connected to a handle which is grasped by an operator to enable the rack mounted assembly to be partially withdrawn from the rack and concurrently disconnected from an electrical connector mounted on the rack. Conversely, subsequent to the rack assembly being fully inserted into the rack to make electrical connections with the electrical connector, the hook is longitudinally rotated by a rotation of the handle to a second position wherein the handle is against the face of the rack mounted component to lock the component into the rack while the hook concurrently engages a surface on the lock block to prevent the handle from being withdrawn.

5 Claims, 6 Drawing Figures

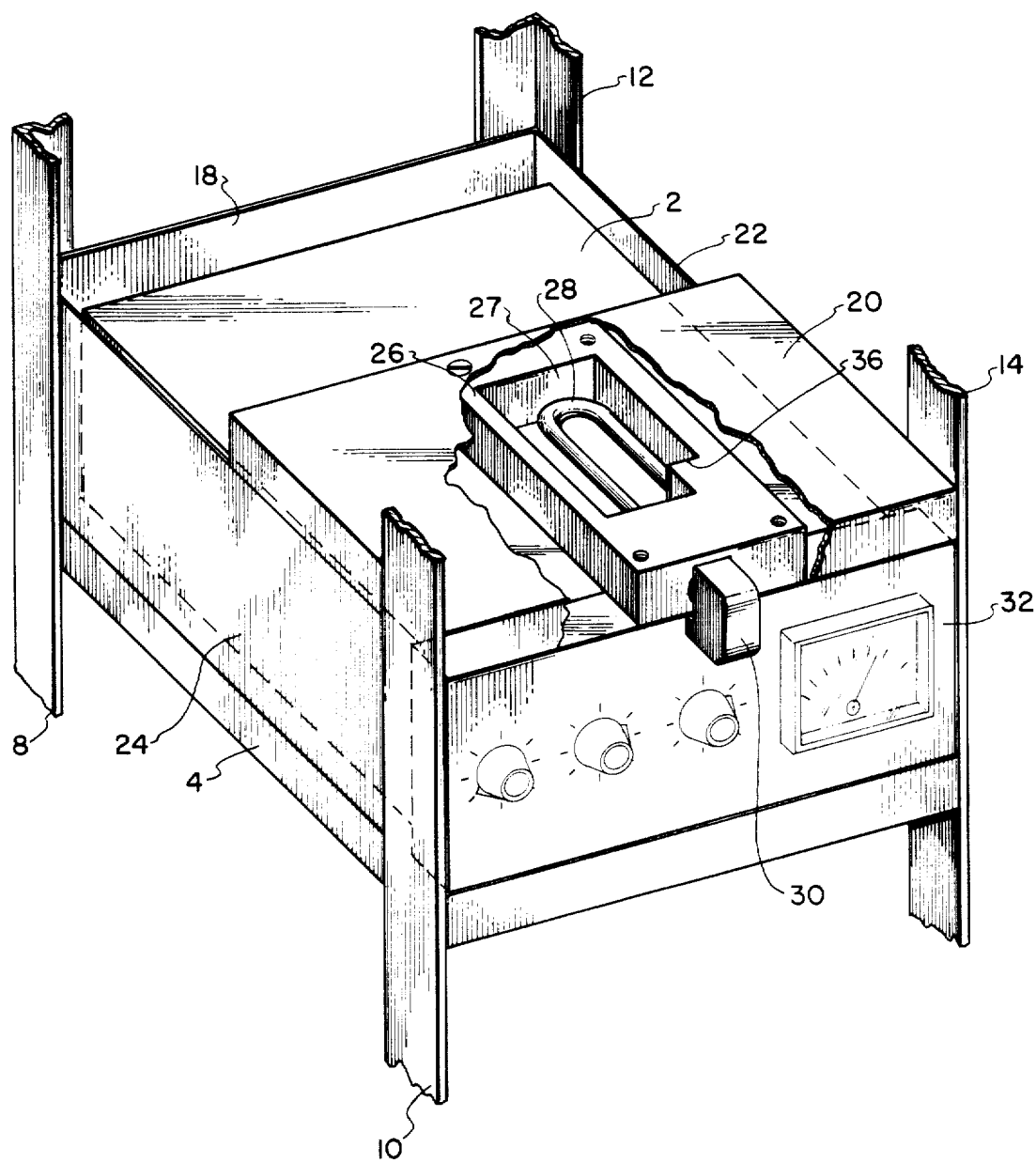
F I G. 1

1

LOCKING AND EXTRACTION MECHANISM FOR RACK MOUNTED COMPONENTS

BACKGROUND OF THE INVENTION

FIELD OF THE INVENTION

The present invention is directed to a mechanism for retention and extraction of a plug-in component. More specifically, the present invention is directed to a combined locking and extraction mechanism for rack mounted components.

SUMMARY OF THE INVENTION

An object of the present invention is to provide an improved locking and extraction mechanism for a rack mounted component.

In accomplishing this and other objects, there has been provided, in accordance with the present invention, a locking and extraction mechanism utilizing a selectively operable extraction hook connected to a handle by an interconnecting shaft slideably mounted on the rack and arranged to engage a front peripheral edge of a mounted component rack in one position of the hook while a second position of the hook engages the hook against lock block mounted on the rack while the handle used to maneuver the hook is positioned against a front face of the rack mounted component to lock the rack mounted component into the rack.

BRIEF DESCRIPTION OF THE DRAWINGS

A better understanding of the present invention may be had when the following detailed description is read in connection with the accompanying drawings, in which:

FIG. 1 is a pictorial illustration of a rack mounted component locked in a rack and showing an example of an embodiment of the lock and extraction mechanism of the present invention.

DESCRIPTION OF THE PREFERRED EMBODIMENT

Figure 2:
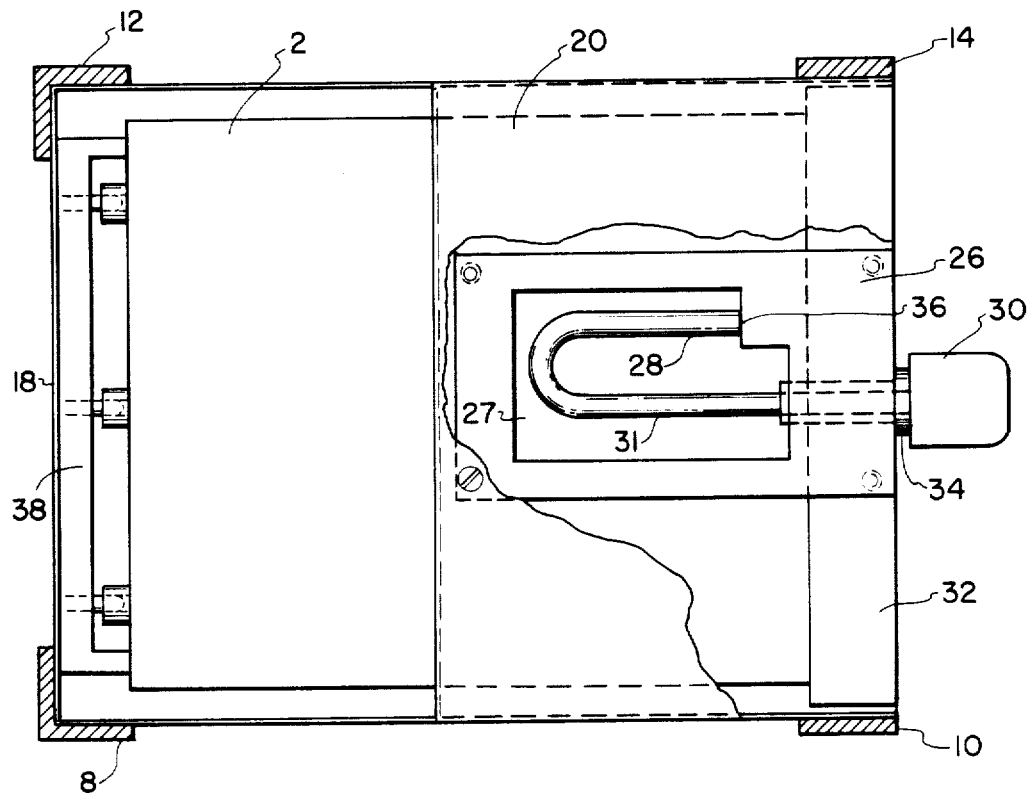
FIG. 2 is a top view of the lock and extraction mechanism shown in FIG. 1.
Figure 3:
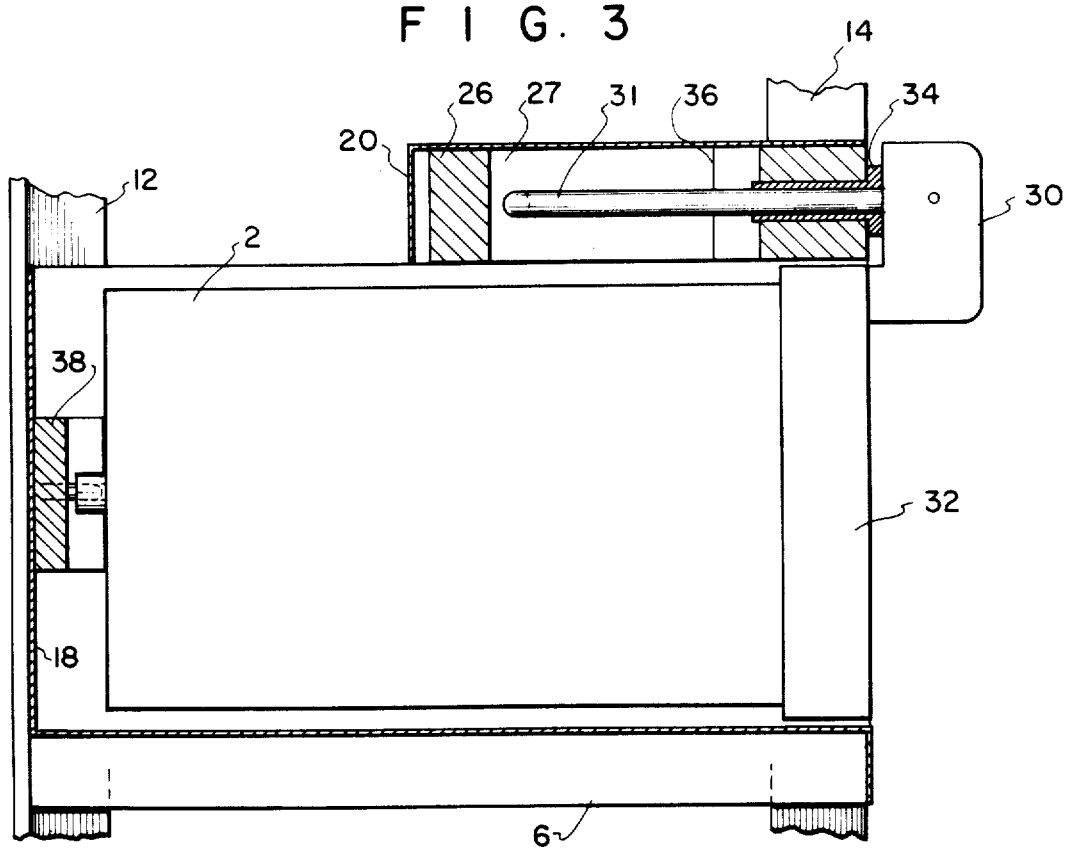
FIG. 3 is a side view of the lock and extraction mechanism shown in FIGS. 1 and 2.

Referring to FIGS. 1, 2 and 3, there is shown a rack assembly or component 2 supported on guides 4 and 6 in a mounting rack having corner posts 8, 10, 12 and 14. An end plate 18 is arranged between corner posts 8 and 12 to support an electrical connector for providing electrical connections to the rack mounted component 2. A cross-piece 20 is positioned transversely across the rack between side supports 22 and 24 extending longitudinally with respect to the rack mounted component 2. The cross-piece 12 is arranged to support a characterized lock block element 26 having a cutout 27 therein. The cutout 27 is arranged to accommodate a U-shaped extraction hook 28 having one end attached to an actuating handle 30 by a shaft 31 which extends through a support bushing 34 located in a front face of the lock block 26. Thus, the handle 30 is located at the front of the rack and has its major longitudinal axis substantially perpendicular to the plane of the hook 28.

A step 36 located on one side of the aperture 27 provides a seat for the other or free end of the hook 28 in a locking position of the handle 30. The height of the step 36 is selected to position the handle 30 against the front face of the component assembly 2 when the assembly 2 is fully inserted in the rack. The electrical connector 38 mounted on the cross piece 18 provides electrical connections to the rack mounted component 2 by engaging electrical connectors on the back of the component 2 when the component 2 is inserted fully into the mounting rack.

As shown in FIGS. 1, 2 and 3, the locking action of the mechanism of the present invention is effected by a rotation of the handle 30 to position an outer surface of the handle 30 against the front face 32 of the rack mounted component 2 while the free end of the hook 28 is concurrently positioned to engage the step 36. In this position, the rack mounted component 2 is locked into the mounting rack by the handle 30.

Figure 4:
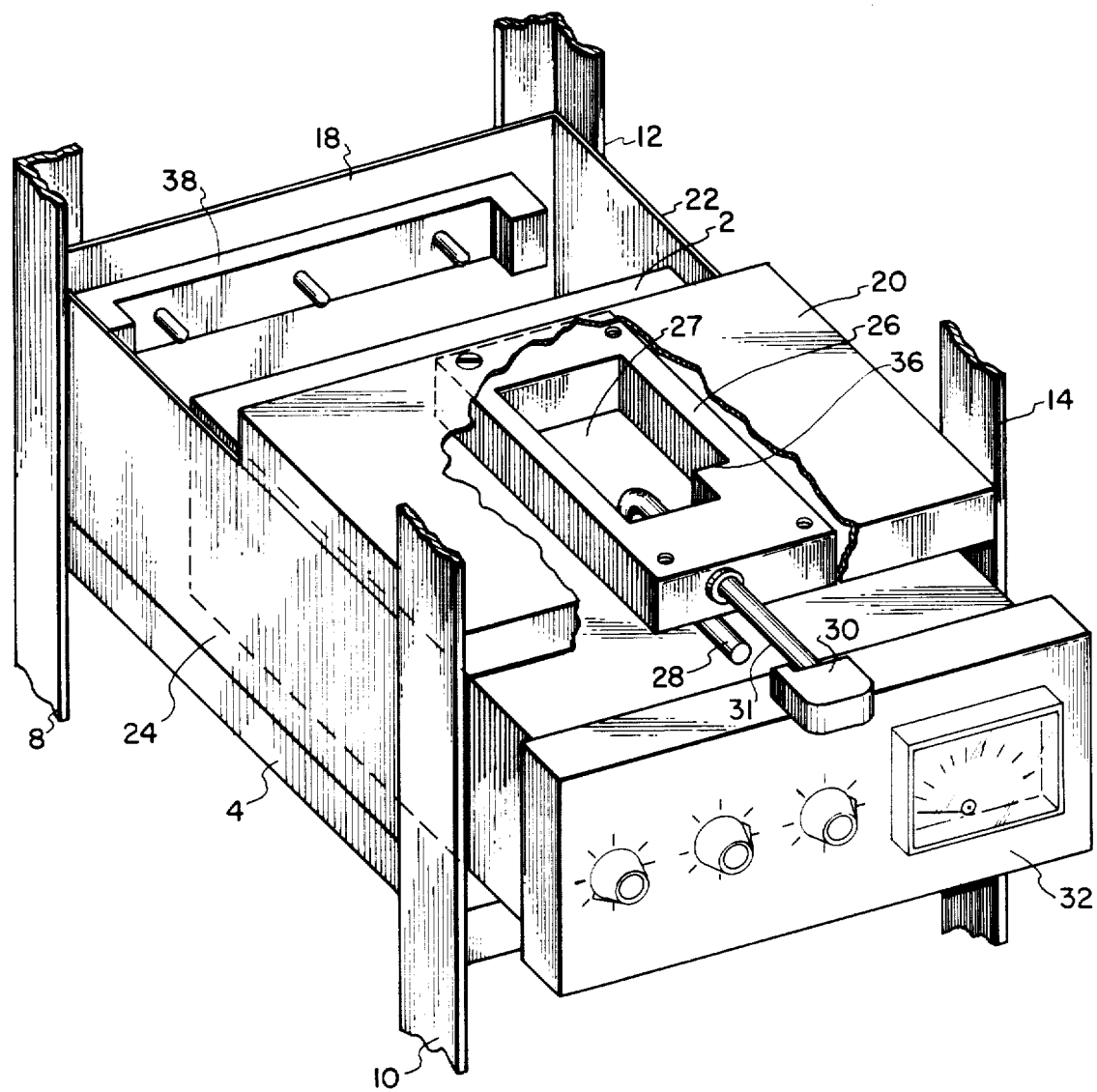
FIG. 4 is a pictorial illustration of a mounted component rack during a rack removal operation and the concurrent operation of the example of an embodiment of the present invention as shown in FIG. 1.
Figure 5:
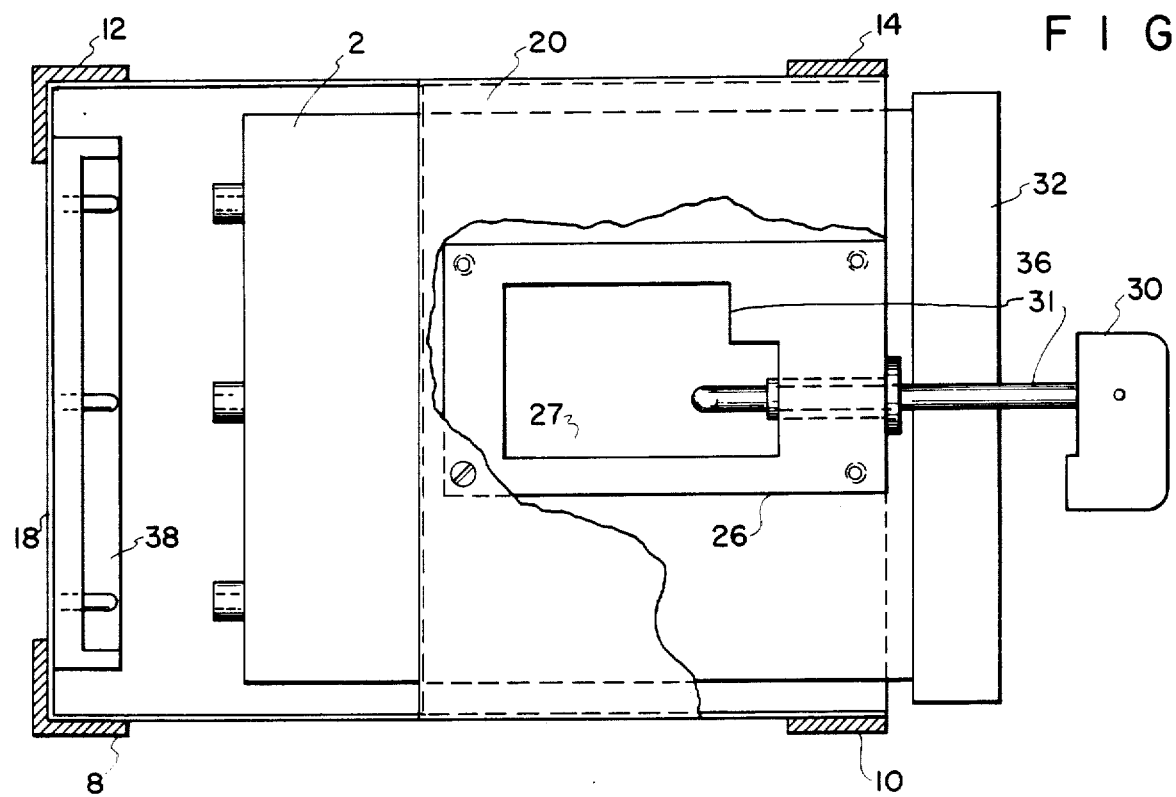
FIG. 5 is a top view of the lock extraction mechanism shown in FIG. 4
Figure 6:
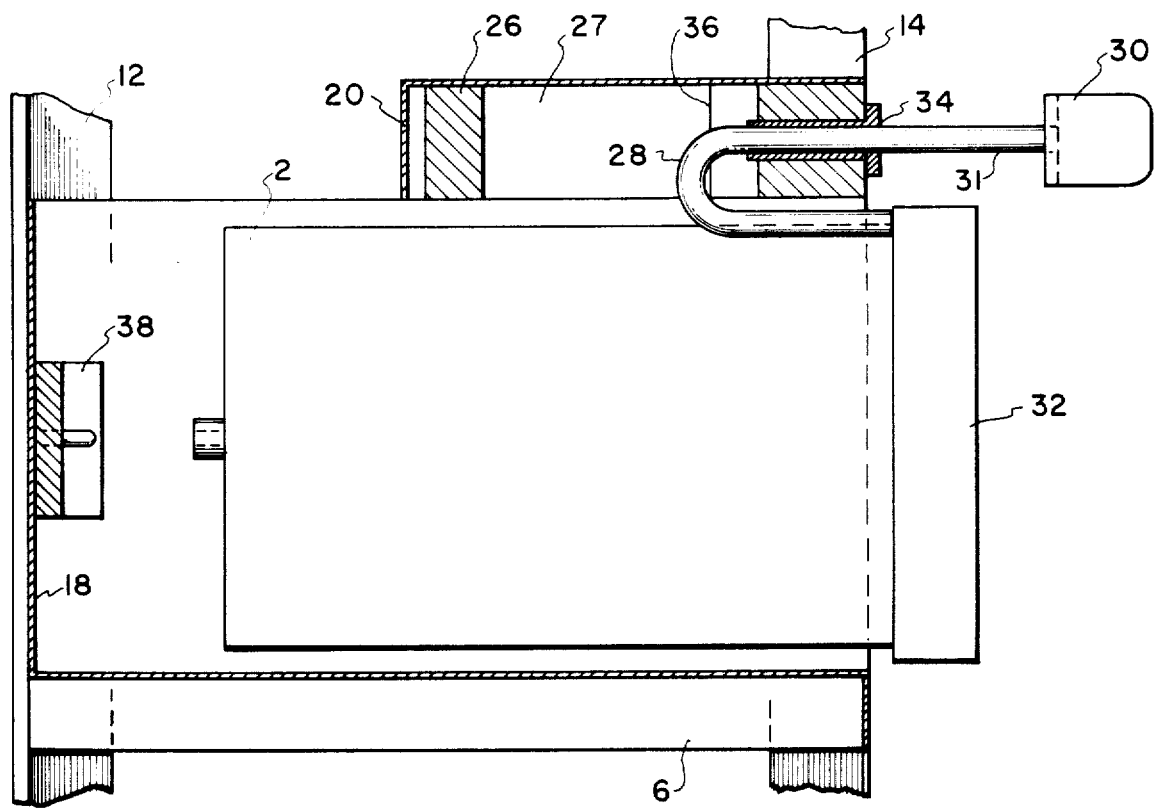
FIG. 6 is a side view of the lock and extraction mechanism shown in FIGS. 4 and 5.

In FIGS. 4, 5 and 6, the mechanism of the present invention is used as an extractor for the rack mounted component 2 by rotating the handle 30 to be clear of the front face 32 of the rack mounted component 2. In this position, the free end of the hook 28 is concurrently disengaged from the step 36 and is located beneath the lock block 26. The handle 30 can then be moved or pulled by an operator to a position away from the mounting rack whereby the free end of the hook 28 ultimately engages the rear surface of the front face 32 of the rack mounted component 2. Subsequently, the handle 30 is used to pull the rack mounted component 2 from the mounting rack to a position where the component 2 is free of the electrical connector 38. In this position, the assembly 2 can then be completely removed, if desired, from the mounting rack. A mounting and locking of the assembly 2 is effected by a reversal of the above operation.

Accordingly, it may be seen, that there has been provided, in accordance with the present invention a locking and extraction mechanism for a rack mounted component.

The embodiments of the invention in which an exclusive property or privilege is claimed are defined as follows:

1. A combined lock and extractor comprising
    a handle selectively positionable between a first position and a second position,
    a U-shaped hook having one end connected to said handle,
    a lock block having an aperture extending therethrough,
    support means for slidably supporting said hook in said lock block to enable a second end of said hook to contact a surface of said lock block within said aperture in said first position of said handle and to pass along an outside surface of said lock block in said second position of said handle and
    mounting means for mounting said lock block in a support rack adjacent to a rack mounted apparatus located in said support rack whereby said first position of said handle is effective to prevent removal of said rack mounted apparatus from said support rack and said second position of said handle is effective to allow a removal of said rack mounted apparatus from said support rack, said second end of said hook being arranged to contact said rack mounted apparatus in said second position of said handle to transmit a force applied to said handle to said rack mounted apparatus to assist in removing said apparatus from said support rack and said handle being arranged to contact a front face of said apparatus in said first position of said handle.

2. A combined lock and extractor as set forth in claim 1 wherein said mounting means is arranged to mount said lock block above said apparatus and adjacent to said apparatus.

3. A combined lock and extractor as set forth in claim 2 wherein said aperture has a step for engaging said second end of said hook in said first position of said hook.

4. A combined lock and extractor as set forth in claim 1 wherein said handle has a major axis substantially perpendicular to a plane of said hook.

5. A combined lock and extractor as set forth in claim 1 wherein said support means includes a bushing extending through said lock block between said aperture and an outside surface of said lock block.

* * * * *